(12) United States Patent
Okabe et al.

(10) Patent No.: US 6,419,501 B1
(45) Date of Patent: Jul. 16, 2002

(54) CONNECTOR FOR FLEXIBLE PRINTED CIRCUIT BOARD

(75) Inventors: Toshiaki Okabe; Toshiaki Ozawa, both of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/400,185

(22) Filed: Sep. 21, 1999

(30) Foreign Application Priority Data

Nov. 18, 1998 (JP) ............................................ 10-328279

(51) Int. Cl.⁷ ................................................ H01R 9/09
(52) U.S. Cl. ........................................................ 439/77
(58) Field of Search ............................. 439/67, 77, 948

(56) References Cited

U.S. PATENT DOCUMENTS

| | | | | |
|---|---|---|---|---|
| 4,241,968 A | * | 12/1980 | Fukunaga | 439/246 |
| 4,374,603 A | * | 2/1983 | Fukunaga et al. | 339/17 F |
| 4,489,999 A | * | 12/1984 | Miniet | 339/17 |
| 5,123,850 A | * | 6/1992 | Elder et al. | 439/67 |
| 5,337,202 A | * | 8/1994 | Jabbarai et al. | 360/97.01 |
| 5,632,630 A | * | 5/1997 | Card et al. | 439/79 |
| 5,993,247 A | * | 11/1999 | Kidd | 439/495 |
| 6,019,625 A | * | 2/2000 | Nimura et al. | 439/259 |

FOREIGN PATENT DOCUMENTS

| | | | | |
|---|---|---|---|---|
| DE | C2 31 08 858 | | 8/1984 | .......... H01R/23/66 |
| DE | 3430573 A1 | * | 10/1984 | |
| DE | A1 42 37 496 | | 5/1994 | ............ H05K/3/32 |
| JP | 5-17971 | * | 5/1993 | |

OTHER PUBLICATIONS

JP 10164730 (Abstact) In: Patent Abstracts of Japan (CD–ROM) (No date).

* cited by examiner

*Primary Examiner*—Brian Sircus
*Assistant Examiner*—Thanh-Tam Le
(74) *Attorney, Agent, or Firm*—Sughrue Mion, PLLC

(57) ABSTRACT

A connector for a flexible printed circuit board includes a male connector 12, having spring terminals 11, and a female connector 15 which is provided with the flexible printed circuit board 13, and has an opening 14 for receiving the terminals 11 of the male connector 12. The flexible printed circuit board 13 is placed on the female connector to cover the opening 14, and then the terminals 11 are pushed into the opening 14 through the flexible printed circuit board 13, and are contacted with the flexible printed circuit board 13. Gaps 20 for allowing the movement of the flexible printed circuit board 13 are provided at the male connector 12.

3 Claims, 4 Drawing Sheets

100
CONNECTOR FOR FLEXIBLE PRINTED CIRCUIT BOARD

BACKGROUND OF INVENTION

1. Field of the Invention

This invention relates to a flexible printed circuit board connector for electrically connecting a flexible printed circuit board.

2. Related Art

As shown in FIG. 4, a conventional flexible printed circuit board connector for electrically connecting a flexible printed circuit board comprises a male connector 32, having spring terminals 31, and a female connector 35 which is provided with the flexible printed circuit board 33, and has an opening 34 for receiving the terminals 31 of the male connector 32.

The flexible printed circuit board 33 is placed on the female connector 35 to cover the opening 34, and then the terminals 31 are pushed into the opening 34 through the flexible printed circuit board 33, and are contacted with the flexible printed circuit board 33.

As shown in FIG. 5, inner side surfaces of the opening 34 in the female connector 35 are flat, and a guide portion 36 (see FIG. 4) for guiding the male connector 32 is formed at a longitudinal end of the opening 34.

The male connector 32 includes a male connector casing 37 made of an insulating material, and the plurality of terminals (terminal plates) 31, corresponding to the number of poles, are mounted in the male connector casing 37. Integrally formed at a rear end of each of the terminals (terminal plates) 31 is a tab terminal 38 for electrical contact with a third connector (not shown).

The terminals (terminal plates) 31 are provided at the front and rear sides of the male connector 32. The front end portion (in a connector-inserting direction) of the terminal (terminal plate) 31 is folded back, and with this construction the terminal 31 has suitable resiliency in a direction of expansion of this folded-back portion (for example, in a right-left direction in FIG. 5), and its contact portion projects from the male connector casing 37.

When the male connector 32 is inserted relative to the female connector 35 in such a manner that a guide projection (not shown), formed on the male connector casing 37, is registered with the guide portion 36 of the female connector 35, the contact portions of the terminals (terminal plates) 31 of the male connector 32 press the flexible printed circuit board 33 against the inner side surfaces of the female connector 35, so that the terminals (terminal plates) 31 are electrically contacted with contact portions of the flexible printed circuit board 33, respectively.

However, in the conventional flexible printed circuit board connector, for example, when the ambient temperature abruptly changes, the dimensions of the parts vary as shown in FIG. 6, and therefore an expansion-contraction load acts on the flexible printed circuit board 33, so that an excessive bending motion develops in the flexible printed circuit board 33 because a flange portion 39 of the male connector 32 abuts against this board 33.

As a result of repetition of this bending motion (indicated by arrow B in FIG. 6), a repeated bending stress develops in that portion of the flexible printed circuit board 33 held by the flange portion 39, which leads to a possibility that conductors on this portion 33a are cut.

SUMMARY OF INVENTION

This invention has been made in order to solve the above problem, and an object of the invention is to provide a flexible printed circuit board connector in which a trouble, such as the cutting of conductors on a flexible printed circuit board by expansion-contraction due to an ambient temperature change, is prevented.

The above object has been achieved by a connector of the invention for a flexible printed circuit board comprising a male connector, having spring terminals, and a female connector which is provided with the flexible printed circuit board, and has an opening for receiving the terminals of the male connector, wherein the flexible printed circuit board is placed on the female connector to cover the opening, and then the terminals are pushed into the opening through the flexible printed circuit board, and are contacted with the flexible printed circuit board; CHARACTERIZED in that a gap for allowing the movement of the flexible printed circuit board is provided at the male connector.

In the flexible printed circuit board connector of the present invention, the terminals, provided at the male connector can have such resiliency as to allow the movement of the flexible printed circuit board.

In the flexible printed circuit board connector of the present invention, even if the flexible printed circuit board repeatedly expands and contracts when the ambient temperature abruptly changes, a bending load will not act in a concentrated manner on one portion of the flexible printed circuit board since the flexible printed board can move, and therefore the cutting of conductors on the flexible printed circuit board is prevented.

In the flexible printed circuit board connector of the present invention, there are provided the gap for allowing the movement of the flexible printed circuit board, and besides the resiliency of the terminals of the male connector prevents the flexible printed circuit board from being held in undue restraint, and therefore the risk of cutting of the conductors is avoided more effectively.

DETAILED DESCRIPTION OF PREFERRED EMBODIMENTS

A preferred embodiment of a flexible printed circuit board connector of the present invention will now be described in detail with reference to the drawings.

Figure 1:
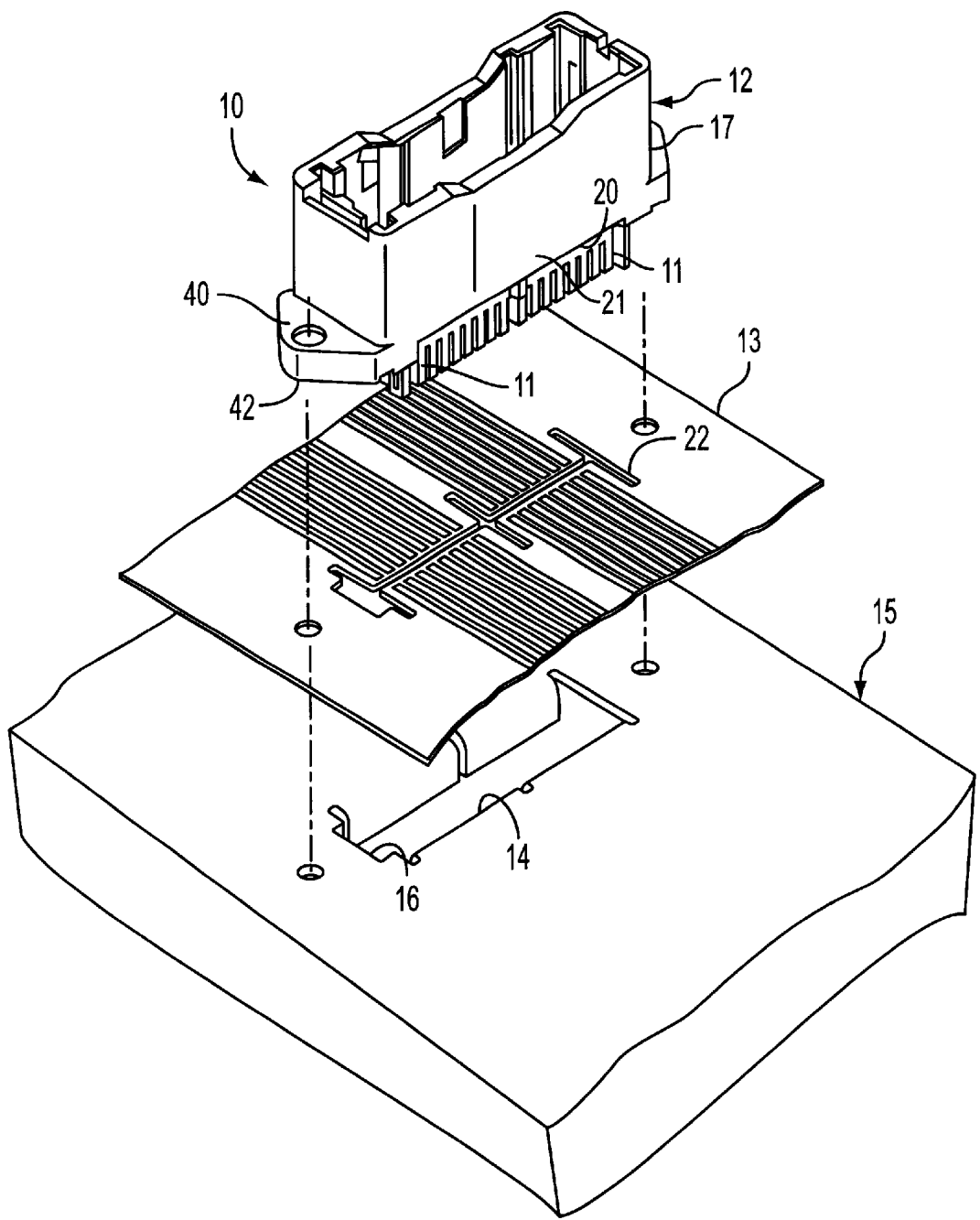
FIG. 1 is a perspective view showing a flexible printed circuit board connector of the present invention.
Figure 2:
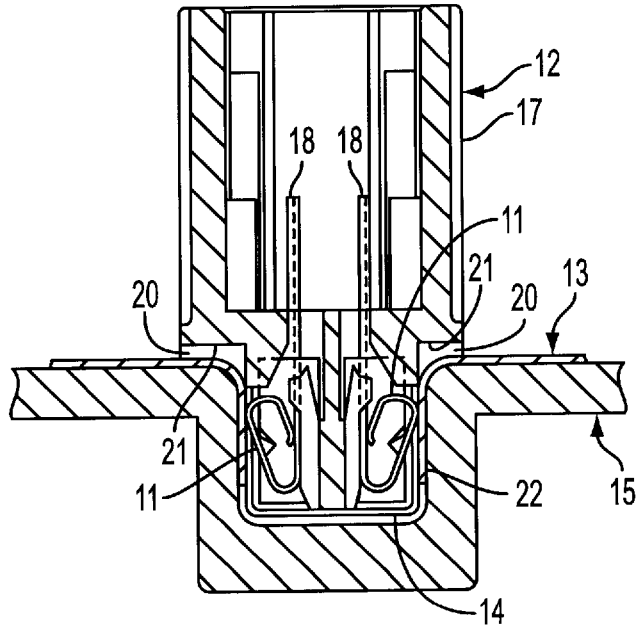
FIG. 2 is a cross-sectional view showing the flexible printed circuit board connector of FIG. 1 in its assembled condition.
Figure 3:
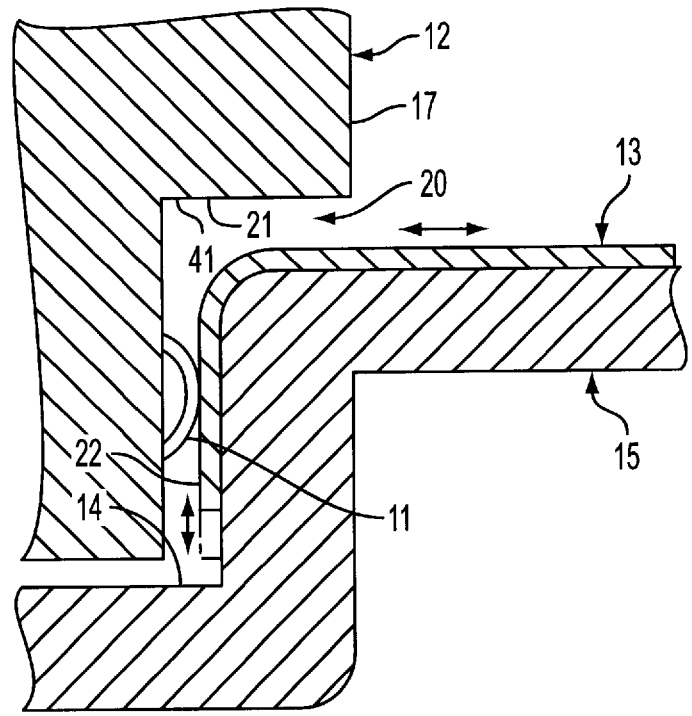
FIG. 3 is a view explanatory of the operation of the flexible printed circuit board connector of the invention.
Figure 4:
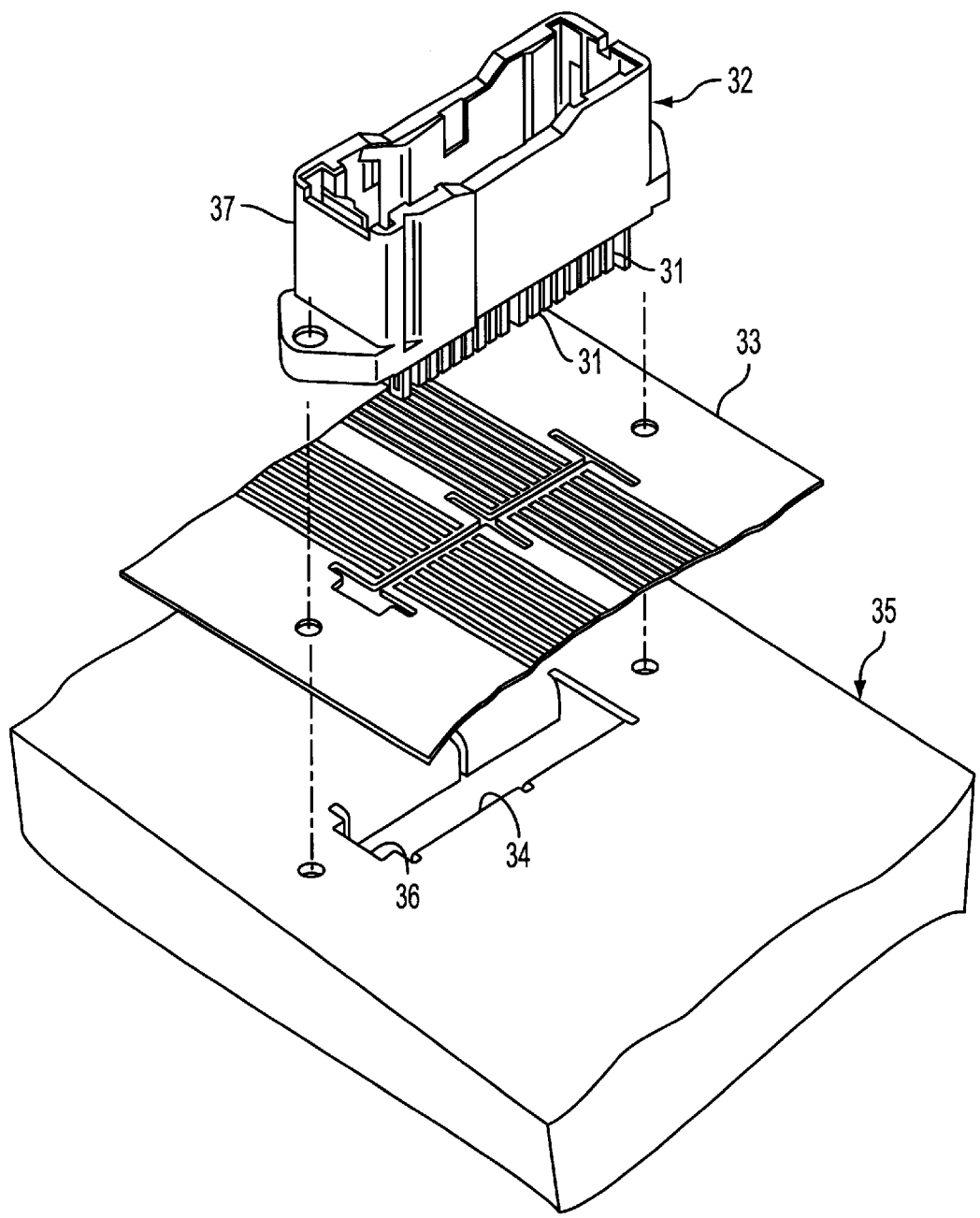
FIG. 4 is a perspective view showing a conventional flexible printed circuit board connector.
Figure 5:
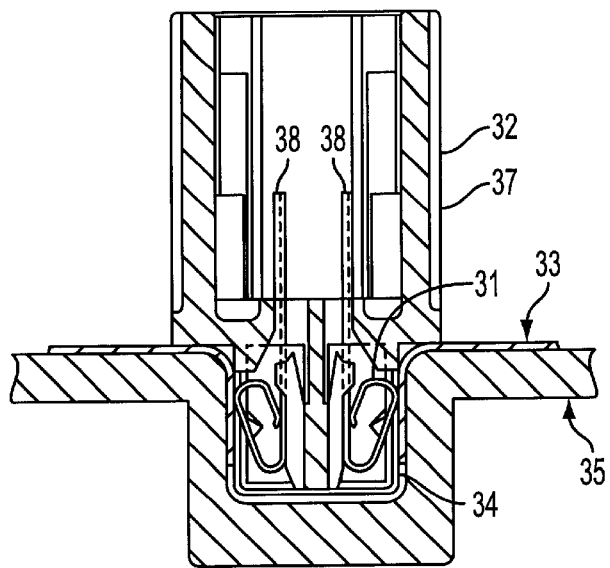
FIG. 5 is a cross-sectional view of the flexible printed circuit board connector of FIG. 4 in its assembled condition.
Figure 6:
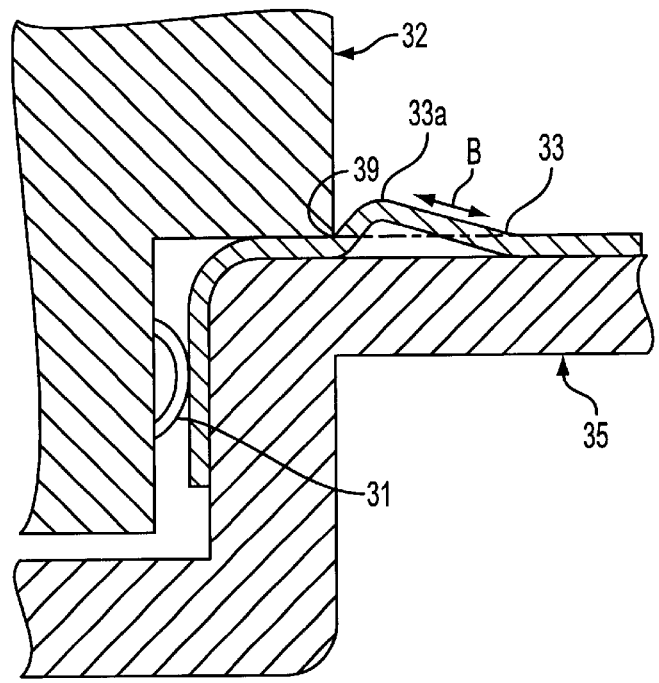
FIG. 6 is a view explanatory of the operation of the conventional flexible printed circuit board connector.

FIG. 1 is a perspective view showing the flexible printed circuit board connector of the present invention, FIG. 2 is a cross-sectional view showing the flexible printed circuit board connector of the invention in its assembled condition, and FIG. 3 is a view explanatory of the operation of the flexible printed circuit board connector of the invention.

As shown in FIG. 1, the flexible printed circuit board connector 10 of the present invention comprises a male connector 12, having spring terminals 11, and a female connector 15 which is provided with a flexible printed circuit board 13, and has an opening 14 for receiving the terminals 11 of the male connector 12.

The flexible printed circuit board 13 is placed on the female connector 15 to cover the opening 14, and then the terminals 11 are pushed into the opening 14 through the flexible printed circuit board 13, and are contacted with the flexible printed circuit board 13.

As shown in FIG. 2, inner side surfaces of the opening 14 in the female connector 15 are flat, and a guide portion 16 (see FIG. 1) for guiding the male connector 12 is formed at a longitudinal end of the opening 14.

The male connector 12 includes a male connector casing 17 made of an insulating material, and the plurality of terminals (terminal plates) 11, corresponding to the number of poles, are mounted in the male connector casing 17. Integrally formed at a rear end of each of the terminals (terminal plates) 11 is a tab terminal 18 for electrical contact with a third connector (not shown). The terminals (terminal plates) 11 are provided at the front and rear sides of the male connector 12. The front end portion (in an inserting direction) of the terminal (terminal plate) is folded back, with this construction the terminal 11 has resiliency, and its contact portion projects from the male connector casing 17.

When the male connector 12 is inserted relative to the female connector 15 in such a manner that a guide projection (not shown), formed on the male connector casing 17, is registered with the guide portion 16 of the female connector 15, the contact portions of the terminals (terminal plates) 11 of the male connector 12 press the flexible printed circuit board 13 against the inner side surfaces of the female connector 15, so that the terminals (terminal plates) 11 are electrically contacted with contact portions of the flexible printed circuit board 13, respectively.

In this flexible printed circuit board connector 10, gaps 20 for allowing the movement of the flexible printed circuit board 13 are provided at the male connector 12. More specifically, the casing includes a first bottom surface 41 and the mounting portion 40 includes a second bottom surface 42. The first bottom surface 41 is disposed above the second bottom surface 42 so as to define gap 20.

The gaps 20 are provided respectively by forming step portions 21 respectively on bottom surfaces of flange portions of the male connector 12. Thus, each gap 20 is formed between the step portion 21 and the female connector 15. Each gap 20 extends over an entire width of contact portions 22 (see FIG. 1) of the flexible printed circuit board 13.

As described above, in the flexible printed circuit board connector 10 of the present invention, the step portions 21 are formed respectively on the flange surfaces of the male connector 12, and with this construction the gaps 20, each larger than the thickness of the flexible printed circuit board 13, are formed between the male connector 12 and the female connector 15. And besides, the terminals (terminal plates) 11 of the male connector 12 have a spring-nature, and therefore the contact portions 22 of the flexible printed circuit board 13 can move in a direction of the surface of this board.

More specifically, when the male connector is fully engaged with the female connector the second bottom surface 42 of the mounting portion is pressed against the top surface of the female connector to securely mount the male connector to the female connector. On the other hand, the gaps are formed between the first bottom surface 41 of the male connector and the top surface of the female connector to allow for movement of the flexible printed circuit board therebetween.

Therefore, even if the flexible printed circuit board 13 repeatedly expands and contracts because of an ambient temperature change, an expansion-contraction load will not act in a concentrated manner on one portion of the flexible printed circuit board 13, and therefore the cutting of conductors on the flexible printed circuit board 13 is positively prevented.

As described above, in the flexible printed circuit board connector of the present invention, the flexible printed circuit board can move, and therefore even if the flexible printed circuit board repeatedly expands and contracts when the ambient temperature changes, a load is prevented from acting in a concentrated manner on one portion of the flexible printed circuit board, and therefore the cutting of the conductors on the flexible printed circuit board is positively prevented. Therefore, there can be provided the flexible printed circuit board connector in which the cutting of the conductors on the flexible printed circuit board by expansion and contraction of the board due to an ambient temperature change is prevented.

In the flexible printed circuit board connector of the present invention, there are provided the gaps for allowing the movement of the flexible printed circuit board, and besides the resiliency of the terminals of the male connector prevents the flexible printed circuit board from being held in undue restraint, and therefore the risk of cutting of the conductors is avoided more effectively, and therefore there can be provided the flexible printed circuit board connector in which the conductors will not be cut by expansion and contraction of the board due to an ambient temperature change.

What is claimed is:

1. A connector for a flexible printed circuit board comprising:

a male connector including a casing, a plurality of spring terminals extending downwardly from said casing and a mounting portion extending laterally from said casing, said casing having a first bottom surface and said mounting portion having a second bottom surface which is disposed below said first bottom surface; and a female connector which is provided with the flexible printed circuit board, and has an opening for receiving said terminals of said male connector, said female connector having a top surface which is substantially parallel to said first bottom surface;

wherein said flexible printed circuit board is placed on said female connector to cover said opening and then said terminals are pushed into said opening through said flexible printed circuit board, and are contacted with said flexible printed circuit board; and wherein when said male connector is fully engaged with said female connector, said second bottom surface is pressed against said top surface to securely mount the male connector to the female connector, whereas a gap is formed between said first bottom surface and said top surface for allowing movement of said flexible printed circuit board therebetween.

2. A connector for a flexible printed circuit board according to claim 1, wherein said terminals, provided at said male connector have such resiliency as to allow the movement of said flexible printed circuit board.

3. A connector for a flexible printed circuit board according to claim 1, wherein said gap is larger than the thickness of said flexible printed circuit board.

* * * * *